United States Patent [19]

Tsutsumi et al.

[11] Patent Number: 4,752,635

[45] Date of Patent: Jun. 21, 1988

[54] HALOGEN-CONTAINING POLYACRYLATE DERIVATIVES

[75] Inventors: Yoshitaka Tsutsumi, Sagamihara; Toru Seita, Atsugi; Hideo Shuyama, Hofu; Kousaburou Matsumura, Yokohama; Kyoko Nakazawa, Machida, all of Japan

[73] Assignee: Toyo Soda Manufacturing Co., Ltd., Shin-nanyo, Japan

[21] Appl. No.: 946,055

[22] Filed: Dec. 24, 1986

[30] Foreign Application Priority Data

Dec. 25, 1985 [JP] Japan .................. 60-290823
Dec. 26, 1985 [JP] Japan .................. 60-291918
Apr. 14, 1986 [JP] Japan .................. 61-84172
May 15, 1986 [JP] Japan .................. 61-109621
Sep. 10, 1986 [JP] Japan .................. 61-211488
Sep. 12, 1986 [JP] Japan .................. 61-214041
Nov. 15, 1986 [JP] Japan .................. 61-270891

[51] Int. Cl.$^4$ .................. C08L 27/12; C08F 18/20; C08F 18/00
[52] U.S. Cl. .................. 524/545; 524/546; 524/245; 524/246
[58] Field of Search .................. 526/292.1, 245, 246; 560/210; 524/545, 546

[56] References Cited

U.S. PATENT DOCUMENTS 3,262,968 7/1966 Sedlak et al. .................. 560/210
3,544,535 12/1970 Gilbert et al. .................. 260/89.5
3,912,607 10/1975 Communal et al. .................. 522/177
4,259,407 3/1981 Tada et al. .................. 522/153
4,454,222 6/1984 Tada et al. .................. 430/331

FOREIGN PATENT DOCUMENTS 61-7311 1/1986 Japan .
61-65237 4/1986 Japan .
170636 8/1986 Japan .

OTHER PUBLICATIONS

Patent Abstracts of Japan, vol. 7, No. 160, (P-210)[1305], Jul. 14, 1983.

Primary Examiner—Joseph L. Schofer
Assistant Examiner—N. Sarofim
Attorney, Agent, or Firm—Oblon, Fisher, Spivak, McClelland & Maier

[57] ABSTRACT

A halogen-containing polyacrylate derivative having the formula:

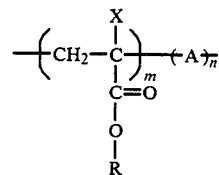

wherein A is a structural unit derived from a copolymerizable monomer having a double bond; R is

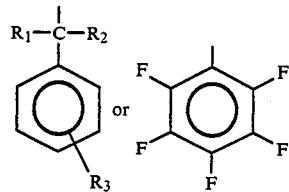

wherein each of $R_1$ and $R_2$ is a hydrogen atom or a fluorinated methyl group, provided $R_1$ and $R_2$ are not hydrogen atoms at the same time, and $R_3$ is a hydrogen atom or a lower alkyl group; X is a halogen atom or a methyl group; and m is a positive integer, n is 0 or a positive integer, and n/m is from 0 to 2, preferably from 0 to 1.

16 Claims, 6 Drawing Sheets

HALOGEN-CONTAINING POLYACRYLATE DERIVATIVES

The present invention relates to a halogen-containing

The present invention relates to a halogen-containing polyacrylate derivative. More particularly, the present invention relates to a polyacrylate derivative containing halogen atoms and benzene rings, a method for forming a resist pattern wherein the halogen-containing polyacrylate derivative is used as a resist material, and a resist composition.

A polymethyl methacrylate (hereinafter referred to simply as PMMA) is well-known as an electron positive resist. Although PMMA has a high resolution, its sensitivity is low, and the dry etching resistance is poor. For the purpose of obtaining high sensitivity, it has been proposed to use a polymer of an ester of (meth)acrylic acid or its derivative with a mono- or poly-fluoroalkanol, as a positive resist for forming a resist pattern by electron beams (Japanese Unexamined Patent Publications No. 18638/1980 and No. 254041/1985). Like PMMA, however, this polymer is inadequate in the dry etching resistance. A polyphenyl methacrylate has higher dry etching resistance than PMMA, but its sensitivity is as low as PMMA.

In recent years, various studies have been made on polymers containing halogen such as fluorine, and such polymers have been practically used in various fields for their useful properties. In particular, an attention has been drawn to their use as a resist material, since they have high sensitivity to electron beams or to X-rays. However, they have a drawback such that their dry etching resistance is inadequate as a resist material, while the recent trend for submicron patterns is moving for a dry process.

Under these circumstances, it is an object of the present invention to obtain a polymer which is useful as a resist material having improved dry etching resistance.

The present invention provides a halogen-containing polyacrylate derivative having the formula:

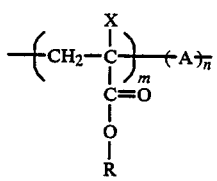

wherein A is a structural unit derived from a copolymeriazable monomer having a double bond; R is

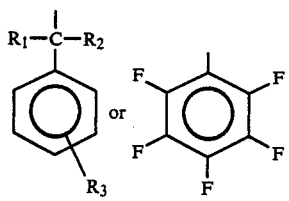

wherein each of $R_1$ and $R_2$ is a hydrogen atom or a fluorinated methyl group, provided $R_1$ and $R_2$ are not hydrogen atoms at the same time, and $R_3$ is a hydrogen atom or a lower alkyl group; X is a halogen atom or a methyl group; and m is a positive integer, n is 0 or a positive integer, and n/m from 0 to 2, preferably from 0 to 1.

The present invention also provides a method for forming a resist pattern by using the halogen-containing polyacrylate derivative as a resist material.

Futher, the present invention provides a resist composition comprising the halogen-containing polyacrylate derivative and a diluent.

Now, the present invention will be described in detail with reference to the preferred embodiments.

In the accompanying drawings.

Figure 1:
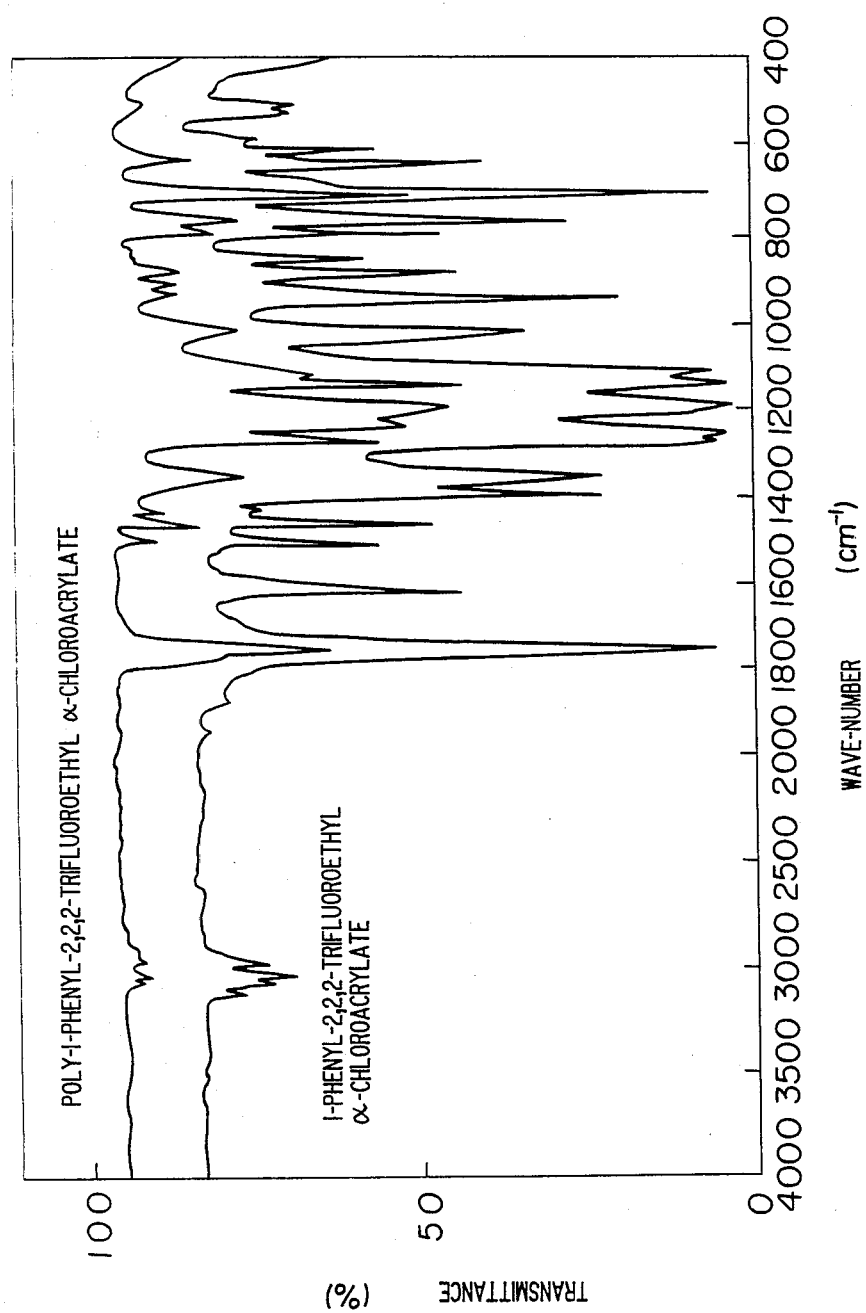
FIG. 1 shows the infrared absorption spectra of poly-1-phenyl-2,2,2-trifluoroethyl α-chloroacrylate and a 1-phenyl-2,2,2-trifluoroethyl α-chloroacrylate monomer as the starting material thereof.

The halogen-containing polyacrylate derivative of the present invention is an α-substituted acrylate polymer containing a halogen atom or a methyl group at the α-position and a fluorine atom and a benzene ring at the ester moiety.

The halogen-containing polyacrylate derivative of the present invention can be obtained by the polymerization of a corresponding acrylate monomer. As the halogen atom at the α-position, fluorine and chlorine are preferred. The substituent on the benzene ring includes hydrogen, fluorine and a lower alkyl group. As the lower alkyl group, an alkyl group having from 1 to 5 carbon atoms is preferred. For instance, a methyl group or an ethyl group may be mentioned.

Specific examples of the α-halogenoacrylate monomer, include 1-phenyl-2,2,2-trifluoroethyl α-chloroacrylate, 2-phenyl-hexafluoroisopropyl α-chloroacrylate, pentafluorophenyl α-chloroacrylate, 1-phenyl-2,2,2-trifluoroethyl α-fluoroacrylate, 2-phenyl-hexafluoroisopropyl α-fluoroacrylate and pentafluorophenyl α-fluoroacrylate. Such an α-halogenoacrylate monomer may be produced, for instance, by the following method.

In the case of an α-chloroacrylate monomer, an acrylate is synthesized by the reaction of acrylic acid chloride with an alcohol corresponding to the ester to be prepared or with its alkali salt, and reacted with chlorine gas to obtain an α, β-dichloropropionate, and then an equimolar amount of quinoline or pyridine is added thereto and the mixture is subjected to distillation under reduced pressure or to refluxing, followed by filtration, extraction and separation by column chromatography, to obtain a desired α-chloroacrylate monomer.

An α-fluoroacrylate monomer may be prepared by reacting a fluoroxalo ester with formalin as disclosed, for instance, in U.S. Pat. No. 3,262,968 or in "Collection of Czechoslovak Chemical Communications", 29, 234 (1964).

The polymer of the present invention can be produced by polymerizing the α-halogenoacrylate monomer by a conventional method such as bulk polymerization, solution polymerization or emulsion polymerization. The degree of polymerization is from 20 to 20,000. As the polymerization initiator, a peroxide such as hydrogen peroxide or benzoyl peroxide, an azo compound such as azobisisobutyronitrile, or a persulfate such as potassium persulfate, may be employed.

Further, the α-halogenoacrylate monomer may be copolymerized with a radical-copolymerizable monomer. As such a radical copolymerizable monomer, there may be mentioned, for example, an acrylate such as methyl acrylate, ethyl acrylate, or butyl acrylate, a methacrylate such as methyl methacrylate, 2-hydroxylethyl methacrylate or glycidyl methacrylate, an α-substituted acrylate such as methyl α-chloroacrylate, methyl α-trifluoromethylacrylate or ethyl α-cyanoacrylate, an unsaturated carboxylic acid such as acrylic acid, methacrylic acid or itaconic acid, an acid amide such as acrylamide, methacrylamide or N-phenylmethacrylamide, a vinyl ester such as vinyl acetate or vinyl propionate, an aromatic vinyl compound such as styrene or α-methylstyrene, acrylonitrile or methacrylonitrile.

The halogen-containing polyacrylate derivative of the present invention can be used for the formation of a resist pattern by means of an electron beam drawing method.

For this purpose, among the halogen-containing polyacrylate derivatives of the present invention, those having a chlorine atom at the α-position are particularly excellent in the sensitivity to electron beams and in the dry etching resistance.

There is no particular restriction as to the manner in which the halogen-containing polyacrylate derivative of the present invention is used for forming a resist pattern by electron beam drawning, and any conventional method may be employed for this purpose.

In the case where the halogen-containinig polyacrylate derivative of the present invention is used as a resist composition, there is no particular restriction as to the coating solvent so long as it is a solvent which is capable of dissolving the polymer and forming a uniform coating film. For instance, xylene, toluene, benzene, tetrahydrofuran, ethylene glycol monoethyl ether acetate or ethylene glycol monomethyl ether acetate, may be mentioned. As the developer, there may be mentioned, for example, a solvent mixture of the above solvent with an alcohol, or a solvent mixture of an ester-type or ketone-type solvent with an alcohol. The coating, prebaking, exposing, developing and other procedures may be conducted in accordance with conventional methods.

Preferably, the resist composition of the present invention comprises from 5 to 30% by weight of the halogen-containing polyacrylate derivative and from 70 to 95% by weight of a diluent or solvent.

Now, the present invention will be described in further detail with reference to Examples. However, it should be understood that the present invention is by no means restricted to these specific Examples.

In the Examples, the electron beam sensitivity tests were conducted in the following manner.

A xylene or ethylene glycol monoethyl ether acetate solution of a polymer was spin-coated on a silicon wafer to obtain a coating film having a thickness of 0.6 μm. Prebaking was conducted at 150°°C. for 30 minutes, and then prescribed portions of the coating film were irradiated with electron beams under an accelerating voltage of 20 kV in various doses. Then, development was conducted by a dipping method at 24° C. to selectively remove the irradiated portions. The sensitivity and the resolution were determined from a sensitivity curve representing the relation between the irradiation doses and the thickness of the films remained after the development.

Here, the sensitivity (hereinafter referred to as S-value) is a value of the irradiation dose at which the thickness of the remained film is 0. The resolution (hereinafter referred to as γ-value is a value represented by the formula $(\log S/Di)^{-1}$ where Di is the irradiation dose at which the film thickness starts to decrease on the tangent line corresponding to the S-value of the sensitivity curve. The larger the value, the higher the resolution. (For further details, see "Most Advanced Application Technique of Fluorine Compounds" K.K. CMC, published on Apr. 24, 1981, p139–140.)

The dry etching resistance tests were conducted by means of a dry etching apparatus DEM-451 Model (Nichiden Anelba K.K.) whereby the resistance against the reactive sputtering by $CF_4$ gas was observed.

EXAMPLE 1

Preparation of 1-phenyl-2,2,2-trifluoroethyl α-chloroacrylate

In 157 g of a 10 wt % sodium hydroxide aqueous solution, 33 g (0.188 mol) of 1-phenyl-2,2,2-trifluoroethanol was dissolved. The solution was cooled with ice, and 20.4 g (0.226 mol) of acrylic acid chloride was dropwise added thereto over a period of one hour. The formed oil phase was extracted with ethyl ether. The ethyl ether solution was washed with water and a saturated sodium chloride aqueous solution, and dried over anhydrous sodium sulfate. Then, ethyl ether was removed by evaporation by an evaporator, and the residual oily substance was distilled under reduced pressure (60° C./2 mmHg) to obtain 37.6 g of a reaction product.

Then, into a 300 ml four-necked flask, 30.0 g of the above reaction product and 100 g of chloroform were introduced, and cooled with ice. While stirring the mixture, chlorine gas was blown into the system at a flow rate of 10 ml/min for 5 hours. Then, chloroform was removed by evaporation by an evaporator, and the residual oily substance was distilled under reduced pressure (91° C./2 mmHg) to obtain 24.0 g of a reaction product.

Then, 5.3 g of pyridine was added to 20.0 g of the above reaction product, and the mixture was stirred 50° C. for 2 hours. After removing the precipitates by filtration, the reaction product was formed into an ethyl ether solution. Then, the ethyl ether solution was washed with water and a saturated sodium chloride aqueous solution, and further dried over anhydrous sodium sulfate. Ethyl ether was removed by evaporation by an evaporator, and the residual oily substance was distilled under reduced pressure (73° C./2 mmHg) to obtain 12.5 g of 1-phenyl-2,2,2-trifluoroethyl α-chloroacrylate.

Preparation of poly-1-phenyl-2,2,2-trifluoroethyl α-chloroacrylate 3.0 g of 1-phenyl-2,2,2-trifluoroethyl α-chloroacrylate, 0.37 ml of a benzene solution containing 0.1 wt % of azobisisobutyronitrile and 3.0 ml of benzene or introduced into a flask, and the flask was evacuated by vacuuming in a usual manner. The mixture in the flask was stirred at 70° C. for 7 hours, and the reaction product was poured into petroleum ether. The polymer was permitted to precipitate, then subjected to filtration and dried to obtain 1.75 g of white precipitates. The obtained polymer was confirmed to be the desired poly-1-phenyl-2,2,2-trifluoroethyl α-chloroacrylate by the elemental analysis, IR and $^{13}$C-NMR.

(1) Elemental analysis

|  | C(%) | H(%) | F(%) | Cl(%) |
|---|---|---|---|---|
| Analytical values: | 49.7 | 3.1 | 22.0 | 13.4 |
| Theoretical values: | 49.9 | 3.0 | 21.6 | 13.4 |

(2) Infrared spectrum (KBr method)
1750 cm$^{-1}$ (C=O stretching vibration)
1500 cm$^{-1}$ (C—C ring stretching vibration)
1460 cm$^{-1}$ (C—C ring stretching vibration)
Disappearence of 1620 cm$^{-1}$ (C=C stretching vibration)

The infrared absorption spectrum of the obtained polymer is shown in FIG. 1. For the purpose of comparison, the infrared absorption spectrum of the monomer is also shown.

(3) $^{13}$C-NMR (solvent: CDCl$_3$, internal standard: CDCl$_3$)

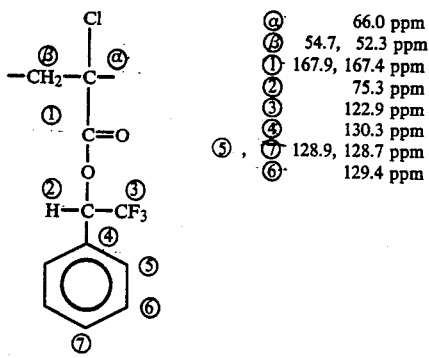

Figure 2:
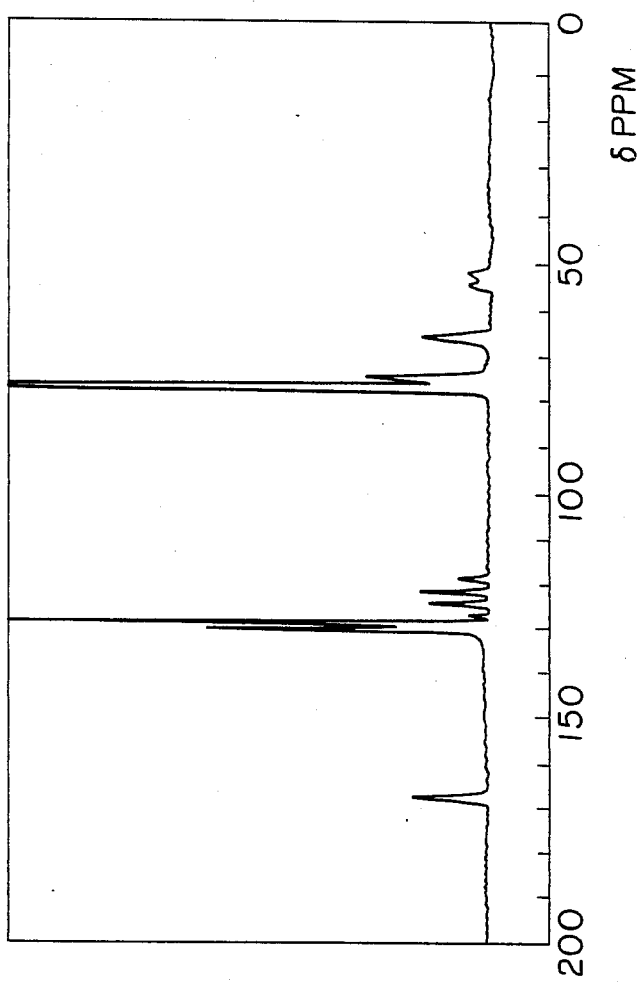
FIG. 2 shows the $^{13}$C-NMR spectrum of the former i.e. poly-1-phenyl-2,2,2-trifluoroethyl α-chloroacrylate.

④  66.0 ppm
⑧  54.7, 52.3 ppm
①  167.9, 167.4 ppm
②  75.3 ppm
③  122.9 ppm
④  130.3 ppm
⑤, ⑦  128.9, 128.7 ppm
⑥  129.4 ppm The $^{13}$C-NMR spectrum of the obtained polymer is shown in FIG. 2.

The weight average molecular weight of the polymer obtained in this Example was found to be $1.4 \times 10^6$ as calculated as polystyrene, as a result of the GPC measurement.

Electron beam sensitivity tests

Then, electron beam sensitivity tests were conducted. In the case where diisopropyl ketone/isopropyl alcohol was used as the developer, a positive type pattern was formed whereby the S-value and the γ-value were 6 μC/cm$^2$ and 2.0, respectively, and in the case where diisobutyl ketone/isopropyl alcohol was used, a positive type pattern was formed whereby the S-value and the γ-value were 20 μC/cm$^2$ and 6.6, respectively.

Dry etching resistance test

The dry etching resistance test of the poly-1-phenyl-2,2,2-trifluoroethyl α-chloroacrylate against the reactive sputtering by CF$_4$ gas, was conducted, whereby the etching rate was 1,700 Å/min. As a Comparative Example, a similar test was conducted with respect to polymethyl methacrylate, whereby the etching rate was 2,200 Å/min.

EXAMPLE 2

2-Phenylhexafluoroisopropyl α-chloroacrylate was polymerized in the same manner as in Example 1 to obtain poly-2-phenylhexafluoroisopropyl α-chloroacrylate. The weight average molecular weight was $1.2 \times 10^6$ as calculated as polystyrene, as a result of the GPC measurement.

Then, the electron beam sensitivity test was conducted. In the case where diisopropyl ketone/isopropyl alcohol was used as the developer, a positive type pattern was formed whereby the S-value and the γ-value were 5 μC/cm$^2$ and 2.0, respectively.

The dry etching resistance test against the reactive sputtering by CF$_4$ gas, was conducted, whereby the etching rate was 1,800 Å/min.

EXAMPLE 3

Preparation of pentafluorophenyl α-chloroacrylate

In 200 g of a 10 wt % sodium hydroxide aqueous solution, 45.0 g (0.245 mol) of pentafluorophenol was dissolved. The solution was cooled with ice, and 26.5 g (0.293 mol) of acylic acid chloride was dropwise added thereto over a period of one hour, and the mixture was stirred for 15 hours. The formed oil phase was extracted with ethyl ether. Then, the ethyl ether solution was washed with water and a saturated sodium chloride aqueous solution, and dried over anhydrous sodium sulfate. Ethyl ether was removed by evaporation by an evaporator, and the residual oily substance was distilled under reduced pressure to obtain 42.8 g of a reaction product.

Then, into a 300 ml four-necked flask, 40.0 g of the above reaction product and 100 g of chloroform were introduced, and cooled with ice. While stirring the mixture, chlorine gas was blown into the system at a flow rate of 50 ml/min for 6 hours. Then, chloroform was removed by evaporation by an evaporator, and the residual oily substance was distilled under reduced pressure to obtain 41.9 g of a reaction product.

Then, 9.2 g of pyridine was added to 40.0 g of the above reaction product, and the mixture was stirred at 50° C. for 2 hours. After the removal of precipitates by filtration, the product was formed into an ethyl ether solution. Then, the ethyl ether solution was washed with water and a saturated sodium chloride aqueous solution, and dried over anhydrous sodium sulfate. Ethyl ether was removed by evaporation by an evaporator, and the residual oily substance was distilled under reduced pressure to obtain 21.2 g of pentafluorophenyl α-chloroacrylate.

Preparation of polypentafluorophenyl α-chloroacrylate 3.0 g of pentafluorophenyl α-chloroacrylate, 0.9 ml of a benzene solution containing 0.1 wt % of azobisisobutyronitrile and 2.5 ml of benzene, were introduced into a flask, and the flask was evacuated by vacuuming in a usual manner. The mixture in the flask was stirred at 170° C. for 9 hours. Then, the reaction product was poured into petroleum ether, and the polymer was permitted to precipitate, then subjected to filtration and dried to obtain 1.6 g of white precipitates.

The polymer thus obtained was confirmed to be the desired polypentafluorophenyl α-chloroacrylate by the elemental analysis, IR and $^{13}$C-NMR.

(1) Elemental analysis

|  | C(%) | H(%) | F(%) | Cl(%) |
|---|---|---|---|---|
| Analytical values: | 39.7 | 0.96 | 34.4 | 12.8 |

-continued

|                   | C(%) | H(%) | F(%) | Cl(%) |
|---|---|---|---|---|
| Theoretical values: | 39.6 | 0.73 | 34.9 | 13.0 |

Figure 3:
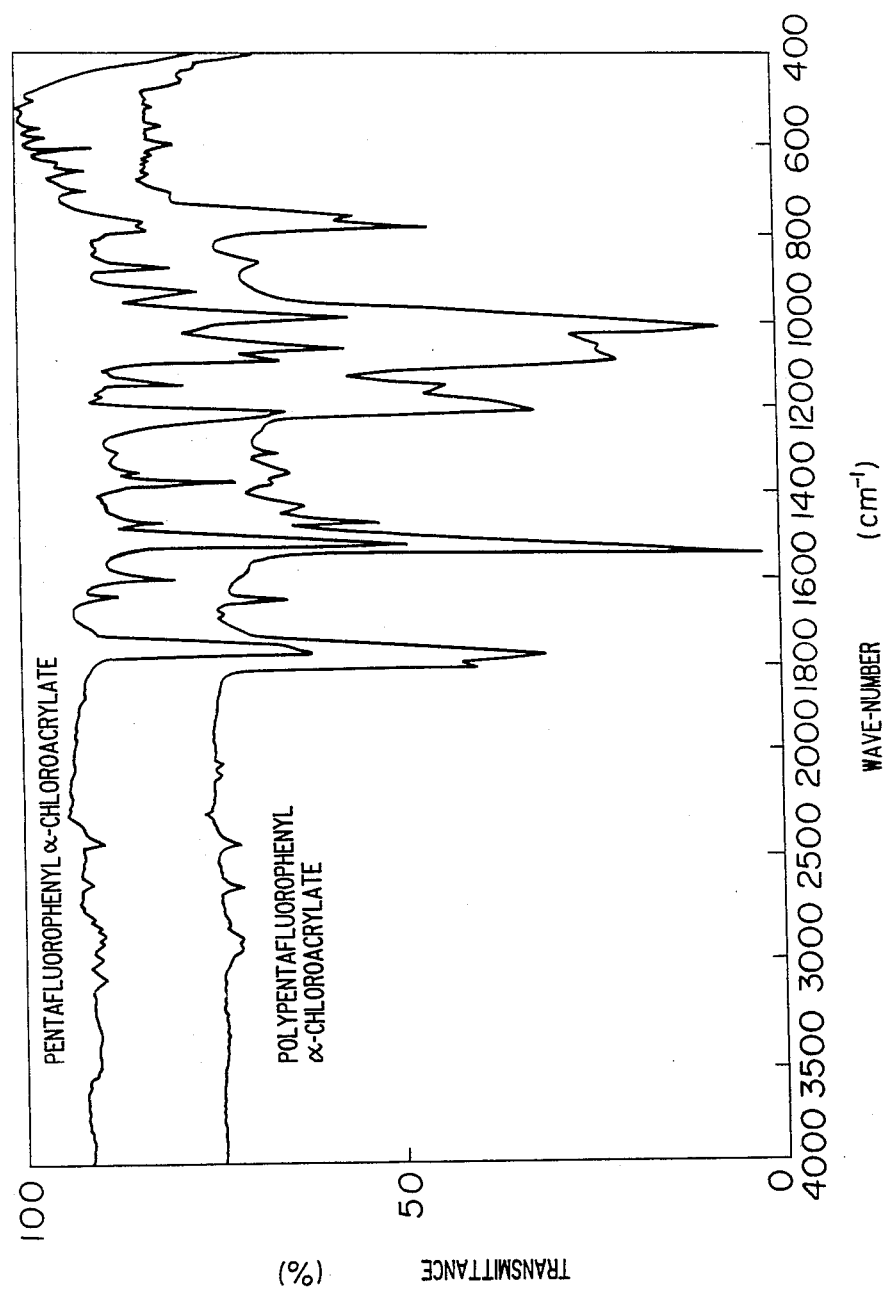
FIG. 3 shows the infrared absorption spectra of polypentafluorophenyl α-chloroacrylate and a pentafluorophenyl α-chloroacrylate monomer as the starting material thereof.

(2) Infrared absorption spectrum (KBr method)
1790 cm$^{-1}$ (C=O stretching vibration)
1550 cm$^{-1}$ (C—C ring stretching vibration)
Disapperance of 1620 cm$^{-1}$ (C=C stretching vibration)
The infrared absorption spectrum is shown in FIG. 3. For the purpose of comparison, the infrared absorption spectrum of pentafluorophenyl α-chloroacrylate is also shown.

(3) $^{13}$C-NMR (solvent CDCl$_3$, internal standard: CDCl$_3$)

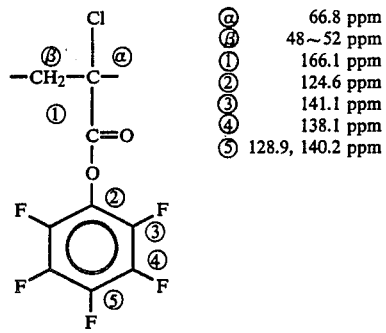

Figure 4:
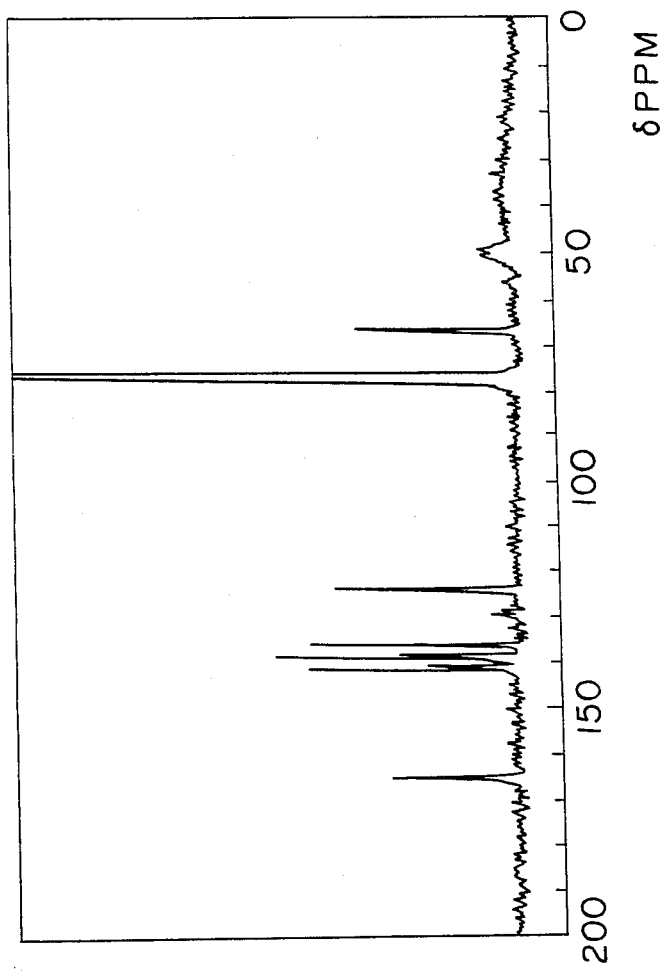
FIG. 4 shows the $^{13}$C-NMR spectrum of the former i.e. polypentafluorophenyl α-chloroacrylate.

② 66.8 ppm
ⓑ 48~52 ppm
① 166.1 ppm
② 124.6 ppm
③ 141.1 ppm
④ 138.1 ppm
⑤ 128.9, 140.2 ppm The $^{13}$C-NMR spectrum is shown in FIG. 4.
The weight average molecular weight of the polymer was found to be 9.1×10$^5$ as calculated as polystyrene, as a result of the GPC measurement.

Electron beam sensitivity test

Then, the electron beam sensitivity test was conducted. In the case where methyl isobutyl ketone/isopropanol was used as the developer, a positive type pattern was formed whereby the S-value and the γ-value were 15 μC/cm$^2$ and 2.0, respectively.

Dry etching resistant test

The dry etching resistant test against the reactive sputtering by CF$_4$ gas, was conducted, whereby the etching rate was 1,650 Å/min.

EXAMPLE 4

In the same manner as in Example 3, a pentafluorophenyl methacrylate monomer was prepared by the reaction of methacrylic acid chloride with pentafluorophenol.

Then, polymerization was conducted by using azobisisobutyronitrile as the initiator, whereby polypentafluorophenyl methacrylate was obtained.

The polymer thus obtained was confirmed to be the desired polypentafluorophenyl methacrylate by the elemetal analysis, IR and $^{13}$C-NMR.

(1) Elemental analysis

|                  | C(%) | H(%) | F(%) |
|---|---|---|---|
| Analysis value:   | 47.5 | 2.1 | 37.3 |
| Theoretical value:| 47.6 | 2.0 | 37.7 |

(2) Infrared absorption spectrum (KBr method)
1780 cm$^{-1}$ (C=O stretching vibration)
1520 cm$^{-1}$ (C—C ring stretching vibration)

Figure 5:
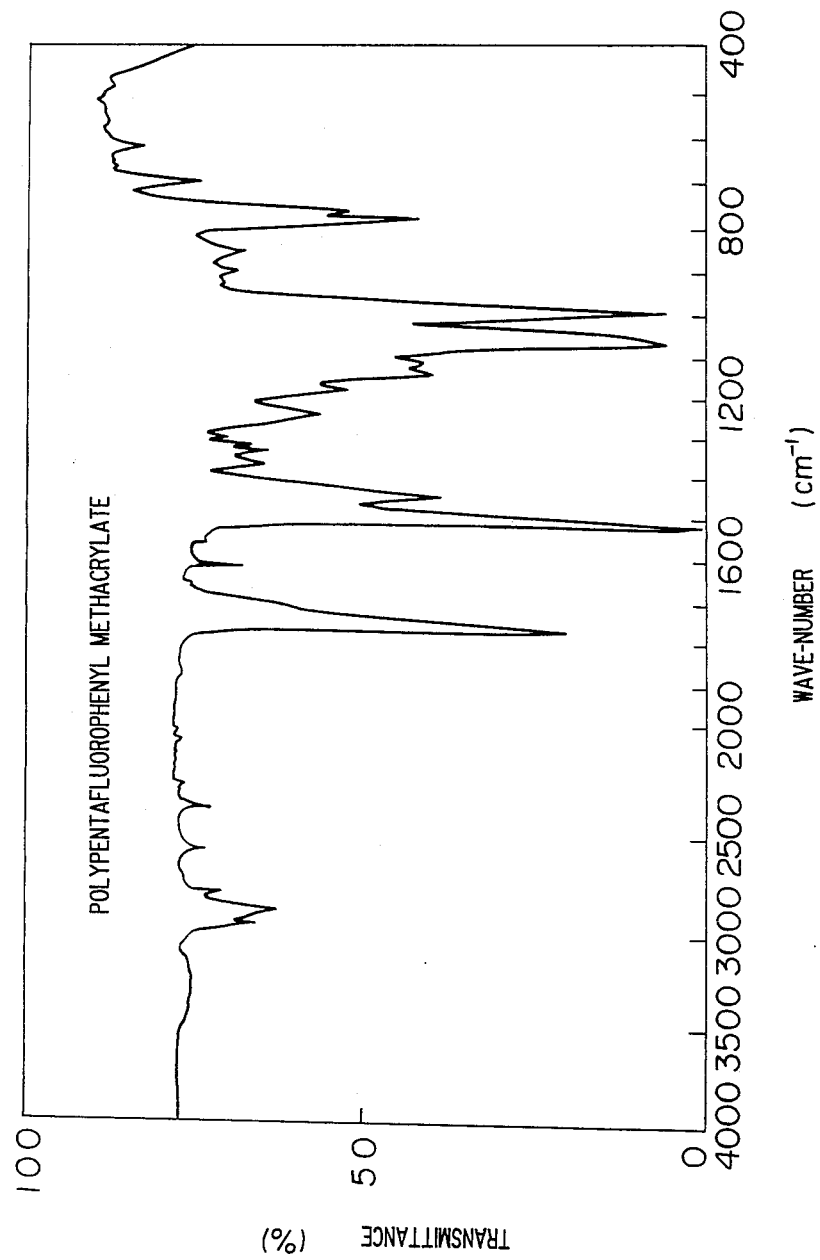
FIGS. 5 and 6 show the infrared absorption spectrum and the 13C-NMR spectrum, respectively, of polypentafluorophenyl methacrylate.

The infrared absorption spectrum is shown in FIG. 5.
(3) $^{13}$C-NMR (solvent: CDCl$_3$, internal standard: CDCl$_3$)

Figure 6:
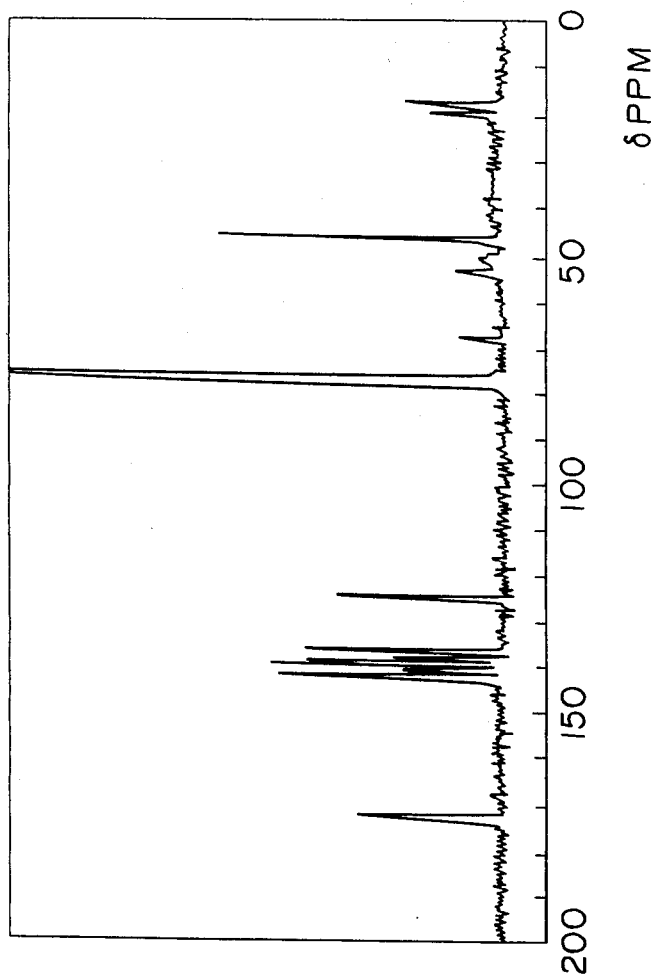

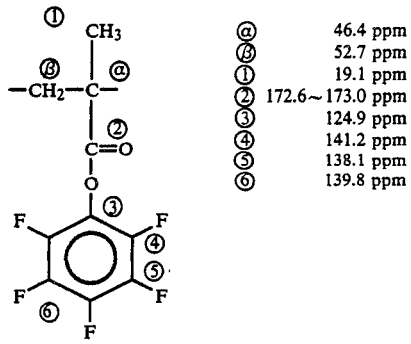

ⓐ 46.4 ppm
ⓑ 52.7 ppm
① 19.1 ppm
② 172.6~173.0 ppm
③ 124.9 ppm
④ 141.2 ppm
⑤ 138.1 ppm
⑥ 139.8 ppm The $^{13}$C-NMR spectrum is shown in FIG. 6.
The weight average molecular weight of the polymer was found to be 9.7×10$^5$ as calculated as polystyrene, as a result of the GPC measurement.

Then, the electron beam sensitivity test was conducted. In the case where methyl isobutyl ketone/isopropanol was used as the developer, a positive type pattern was formed whereby the S-value and the γ-value were 25 μC/cm$^2$ and 2.2, respectively.

EXAMPLE 5

1.26 g of 1-phenyl-2,2,2-trifluoroethyl α-chloroacrylate, 0.74 g of methacrylnitrile, 0.52 ml of a benzene solution containing 0.1 wt % of azobisisobutyronitrile and 1.75 ml of benzene were introduced into a flask, and the flask was evacuated by vacuuming in a usual manner. The mixture in the flask was stirred at 70° C. for 20 hours, and then the reaction product was poured into methanol. The polymer was permitted to precipitate, then subjected to filtration and dried to obtain a 1-phenyl-2,2,2-trifluoroethyl α-chloroacrylate/methacrylnitrile copolymer. The copolymerization ratio was found to be 50/50 by molar ratio as a result of the elemental analysis. The weight average molecular weight was found to be 4.0×10$^5$ as calculated as polystyrene, as a result of the GPC measurement.

Then, the electron beam sensitivity test was conducted. In a case where development was conducted for one minute by using methyl isobutyl ketone/isopropyl alcohol as the developer, a positive pattern was formed whereby the S-value and the γ-value were 10 μC/cm$^2$ and 3.1, respectively.

The dry etching resistance test against the reactive sputtering by CF$_4$ was conducted, whereby the etching rate was 1,500 Å/min.

EXAMPLE 6

2.58 g of 1-phenyl-2,2,2-trifluoroethyl α-chloroacrylate, 0.42 g of methyl methacrylate, 0.46 ml of a benzene solution containing 0.1 wt % of azobisisobutyronitrile and 2.9 ml of benzene were introduced into a flask, and a polymer was prepared in the same manner as in Example 5. The copolymerization ratio was found to be 76/24 by molar ratio, as a result of the elemental analysis. The weight average molecular weight was found to be 1.4×10$^6$ as calculated as polystyrene, as a result of the GPC measurement.

Then, the electron beam sensitivity test was conducted. In the case where development was conducted for one minute by using diisopropyl ketone/isopropyl alcohol as the developer, a positive pattern was formed whereby the S-value and the γ-value were 20 μC/cm² and 5.5, respectively.

The dry etching resistance test against the reactive sputtering by CF₄ gas were conducted, whereby the etching rate was 1,900 Å/min.

EXAMPLE 7

2.30 g of 1-phenyl-2,2,2-trifluoroethyl α-chloroacrylate, 0.70 g of 2,2,2-trifluoroethyl α-chloroacrylate, 0.41 ml of a benzene solution containing 0.1 wt % of azobisisobutyronitrile and 3.0 ml of benzene were introduced into a flask, and a polymer was prepared in the same manner as in Example 5. The copolymerization ratio was found to be 70/30 by molar ratio, as a result of the elemetal analysis. The weight average molecular weight was found to be $1.0 \times 10^6$ as calculated as polystyrene, as a result of the GPC measurement.

Then, the electron beam sensitivity test was conducted. In the case where development was conducted for 10 minutes by using ethylene glycol monoethyl ether/isopropyl alcohol as the developer, a positive type pattern was formed whereby the S-value and the γ-value were 15 μC/cm² and 4.5, respectively.

The dry etching resistance test against the reactive sputtering by CF₄ was conducted, whereby the etching rate was 2,000 Å/min.

EXAMPLE 8

1.47 g of 1-phenyl-2,2,2-trifluoroethyl α-chloroacrylate, 0.53 g of 2,2,3,3-tetrafluoropropyl α-chloroacrylate, 0.26 ml of a benzene solution containing 0.1 wt % of azobisisobutyronitrile and 2.0 ml of benzene were introduced into a flask, and a polymer was prepared in the same manner as in Example 5. The copolymerization ratio was found to be 72/28 by molar ratio, as a result of the elemental analysis. The weight average molecualr weight was found to be $1.6 \times 10^6$ as calculated as polystyrene, as a result of the GPC measurement.

Then, the electron beam sensitivity test was conducted. In the case where development was conducted for one minute by using diisobutyl ketone/isopropyl alcohol as the developer, a positive pattern was formed, whereby the S-value and the γ-value were 14 μC/cm² and 4.8, respectively.

The dry etching resistance test against the reactive sputtering by CF₄ gas was conducted, whereby the etching rate was 2,000 Å/min.

The halogen-containing polyacrylate derivatives, particularly the α-halo derivatives, of the present invention are acrylate polymers which contain a halogen atom at the α-position and a fluorine atom and a benzene ring at the ester moiety, and when irradiated with electron beams or X-rays, they undergo the main chain degradation reaction, whereby the irradiated portions will have a substantially larger solubility than the non-irradiated portions.

Polymethylmethacrylate or polyphenylmethacrylate also undergoes the main chain degradation when irradiated with such radiations. However, the halogen-containing polyacrylate derivatives, particularly the α-halo derivatives of the present invention more readily undergo the degradation reaction because they contain halogen atoms at the α-position and at the ester moiety. Accordingly, they have a higher sensitivity.

Further, the halogen-containing polyacrylate derivatives of the present invention have excellent dry etching resistance by virtue of the benzene ring contained therein.

We claim:

1. A halogen-containing polyacrylate derivative having the formula:

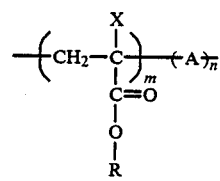

wherein A is a structural unit derived from a copolymerizable monomer having a double bond; R is

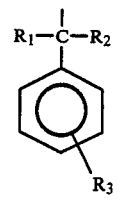

wherein each of $R_1$ and $R_2$ is a hydrogen atom or a fluorinated methyl group, provided $R_1$ and $R_2$ are not hydrogen atoms at the same time, and $R_3$ is a hydrogen atom or a lower alkyl group; X is a halogen atom or a methyl group; and m is a positive integer, n is 0 or a positive integer, and n/m is from 0 to 2.

2. A halogen-containing polyacrylate derivative having the formula:

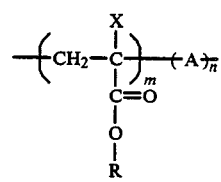

wherein A is a structural unit derived from a copolymerizable monomer having a double bond; R is

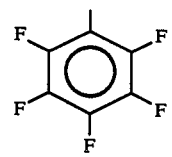

X is a halogen atom or a methyl group; and m is a positive integer, n is 0 or a positive integer, and n/m is from 0 to 2.

3. A resist composition comprising a halogen-containing polyacrylate derivative having the formula:

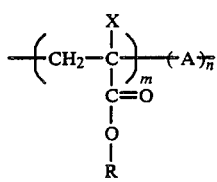

wherein A is a structural unit derived from a copolymerizable monomer having a double bond; R is

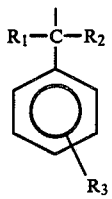

wherein each of $R_1$ and $R_2$ is a hydrogen atom or a fluorinated methyl group, provided $R_1$ and $R_2$ are not hydrogen atoms at the same time, and $R_3$ is a hydrogen atom or a lower alkyl group; X is a halogen atom or a methyl group; and m is a positive integer, n is 0 or a positive integer, and n/m is from 0 to 2, and a diluent.

4. A resist composition comprising a halogen-containing polyacrylate derivative having the formula:

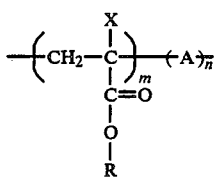

wherein A is a structural unit derived from a copolymerizable monomer having a double bond; R is

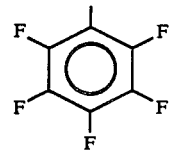

X is a halogen atom or a methyl group; and m is a positive integer, n is 0 or a positive integer, and n/m is from 0 or 2, and a diluent.

5. The halogen-containing polyacrylate derivative according to claim 1, wherein X is a chlorine atom.

6. The halogen-containing polyacrylate derivative according to claim 1, wherein X is a methyl group.

7. The resist composition according to claim 3, wherein X of the halogen-containing polyacrylate derivative is a chlorine atom.

8. The resist composition according to claim 3, wherein X in the halogen-containing polyacrylate derivative is a methyl group.

9. The resist composition according to claim 3, which comprises from 5 to 30% by weight of the halogen-containing polyacrylate derivative and from 70 to 95% by weight of the diluent.

10. The halogen-containing polyacrylate derivative according to claim 2, wherein X is a chlorine atom.

11. The halogen-containing polyacrylate derivative according to claim 2, wherein X is a methyl group.

12. The halogen-containing polyacrylate derivative according to claim 1, wherein $R_1=R_2=CF_3$, and X=chlorine.

13. The halogen-containing polyacrylate derivative according to claim 1, wherein $R_1=H$, $R_2=CF_3$, and X=chlorine.

14. The resist composition according to claim 4, wherein X of the halogen-containing polyacrylate derivative is a chlorine atom.

15. The resist composition according to claim 4, wherein X of the halogen-containing polyacrylate derivative is a chlorine atom.

16. The resist composition according to claim 4, which comprises from 5 to 30% by weight of the halogen-containing polyacrylate derivative and from 70 to 95% by weight of the diluent.

* * * * *